US009261556B2

(12) United States Patent
McShane et al.

(10) Patent No.: US 9,261,556 B2
(45) Date of Patent: Feb. 16, 2016

(54) OPTICAL WAFER AND DIE PROBE TESTING

(71) Applicant: Freescale Semiconductor, Inc., Austin, TX (US)

(72) Inventors: Michael B. McShane, Austin, TX (US); Perry H. Pelley, Austin, TX (US); Tab A. Stephens, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/913,993

(22) Filed: Jun. 10, 2013

(65) Prior Publication Data

US 2014/0363905 A1    Dec. 11, 2014

(51) Int. Cl.
| | |
|---|---|
| *H01L 21/00* | (2006.01) |
| *G01R 31/27* | (2006.01) |
| *G02B 6/42* | (2006.01) |
| *G02B 6/30* | (2006.01) |
| *G01R 31/28* | (2006.01) |

(Continued)

(52) U.S. Cl.
CPC ............. *G01R 31/275* (2013.01); *G01M 11/00* (2013.01); *G01R 31/2886* (2013.01); *G01R 31/2889* (2013.01); *G02B 6/30* (2013.01); *G02B 6/42* (2013.01); *H01L 22/10* (2013.01); *H01L 22/12* (2013.01)

(58) Field of Classification Search
CPC ......... H01L 22/10; H01L 22/12; H01L 21/78; G01R 31/311; G01R 31/2889; G01R 31/302; G01R 31/275; G01R 31/2886; G02B 6/30; G02B 6/4214; G02B 6/12004

USPC ............. 438/16, 17, 7, 462–465; 324/754.23, 324/762.03, 762.05, 755.01; 356/219, 221

See application file for complete search history.

(56) References Cited

U.S. PATENT DOCUMENTS

| | | | |
|---|---|---|---|
| 4,653,850 A | | 3/1987 | Boirat et al. |
| 4,828,358 A | * | 5/1989 | Blonder .......................... 385/18 |

(Continued)

FOREIGN PATENT DOCUMENTS

| | | |
|---|---|---|
| EP | 1172680 A2 | 1/2002 |
| WO | 2006136194 A1 | 12/2006 |

OTHER PUBLICATIONS

Wang, Wei-Chih et al., Development of an Optical Waveguide Cantilever Scanner, Proceedings of SPIE, vol. 4876, 2003, pp. 72-83.

(Continued)

*Primary Examiner* — Michael Trinh
(74) *Attorney, Agent, or Firm* — Terrile, Cannatti, Chambers & Holland, LLP; Michael Rocco Cannatti

(57) ABSTRACT

An optical die probe wafer testing circuit arrangement and associated testing methodology are described for mounting a production test die (157) and surrounding scribe grid (156) to a test head (155) which is positioned over a wafer (160) in alignment with a die under test (163) and surrounding scribe grid (161, 165), such that one or more optical deflection mirrors (152, 154) in the test head scribe grid (156) are aligned with one or more optical deflection mirrors (162, 164) in the scribe grid (161, 165) for the die under test (163) to enable optical die probe testing on the die under test (163) by directing a first optical test signal (158) from the production test die (157), through the first and second optical deflection mirrors (e.g., 152, 162) and to the first die.

19 Claims, 6 Drawing Sheets

(51) Int. Cl.
*H01L 21/66* (2006.01)
*G01M 11/00* (2006.01)

(56) References Cited

U.S. PATENT DOCUMENTS

| | | | |
|---|---|---|---|
| 5,483,174 A | 1/1996 | Hembree et al. |
| 5,534,784 A | 7/1996 | Lum et al. |
| 5,631,571 A | 5/1997 | Spaziani et al. |
| 6,055,342 A | 4/2000 | Yi et al. |
| 6,325,553 B1 | 12/2001 | Deacon et al. |
| 6,335,224 B1 | 1/2002 | Peterson et al. |
| 6,417,107 B1 | 7/2002 | Sekimura |
| 6,477,303 B1 | 11/2002 | Witherspoon |
| 6,556,285 B1 | 4/2003 | Dickson |
| 6,650,810 B1 | 11/2003 | Lieberman et al. |
| 6,686,993 B1 | 2/2004 | Karpman et al. |
| 6,690,845 B1 | 2/2004 | Yoshimura et al. |
| 6,753,037 B2 | 6/2004 | Miller et al. |
| 6,765,396 B2 | 7/2004 | Barror |
| 6,813,584 B2 | 11/2004 | Zhou et al. |
| 6,850,081 B1 | 2/2005 | Birdsley et al. |
| 6,865,311 B2 | 3/2005 | Li et al. |
| 6,897,663 B1 | 5/2005 | Conn |
| 6,909,830 B2 | 6/2005 | Lee et al. |
| 6,936,491 B2 | 8/2005 | Partridge et al. |
| 6,950,570 B1 | 9/2005 | Novotny |
| 6,999,651 B2 | 2/2006 | Qian et al. |
| 7,016,564 B1 | 3/2006 | Graves |
| 7,020,363 B2 | 3/2006 | Johannessen |
| 7,042,563 B2 | 5/2006 | Wilsher et al. |
| 7,071,025 B2 | 7/2006 | Brenner et al. |
| 7,183,759 B1 | 2/2007 | Malendevich et al. |
| 7,224,174 B1 | 5/2007 | Malendevich et al. |
| 7,298,536 B2 | 11/2007 | McCann et al. |
| 7,379,191 B2 | 5/2008 | Brooks |
| 7,427,868 B2 | 9/2008 | Strid et al. |
| 7,444,042 B1 | 10/2008 | Niblock et al. |
| 7,450,812 B2 | 11/2008 | Romo et al. |
| 7,474,420 B2 | 1/2009 | Li et al. |
| 7,555,333 B2 | 6/2009 | Wang et al. |
| 7,586,608 B1 | 9/2009 | Gunn, III et al. |
| 7,612,737 B2 | 11/2009 | Bright et al. |
| 7,664,349 B2 | 2/2010 | Holmstrom et al. |
| 7,824,945 B2 | 11/2010 | Chang et al. |
| RE42,124 E | 2/2011 | Riza |
| 7,982,765 B2 | 7/2011 | Lewis et al. |
| 8,004,080 B2 | 8/2011 | McShane et al. |
| 8,014,682 B2 | 9/2011 | Pelley et al. |
| 8,032,030 B2 | 10/2011 | Pessoa et al. |
| 8,064,739 B2 | 11/2011 | Binkert et al. |
| 8,218,917 B2 | 7/2012 | Sano et al. |
| 8,260,151 B2 | 9/2012 | Pelley et al. |
| 8,442,368 B1 | 5/2013 | Reano et al. |
| 8,749,772 B2 | 6/2014 | Busico et al. |
| 8,750,660 B2 | 6/2014 | Levy et al. |
| 8,916,874 B2 | 12/2014 | Whitbread et al. |
| 9,091,820 B2 | 7/2015 | Stephens et al. |
| 9,094,135 B2 | 7/2015 | Pelley et al. |
| 2002/0012744 A1 | 1/2002 | Miller et al. |
| 2002/0132389 A1 | 9/2002 | Patel et al. |
| 2003/0043289 A1 | 3/2003 | Konno |
| 2003/0199109 A1 | 10/2003 | Kuzma |
| 2004/0013359 A1 | 1/2004 | Lee et al. |
| 2004/0036170 A1 | 2/2004 | Lee et al. |
| 2004/0122328 A1 | 6/2004 | Wang et al. |
| 2004/0245586 A1 | 12/2004 | Partridge et al. |
| 2004/0248344 A1 | 12/2004 | Partridge et al. |
| 2005/0025414 A1 | 2/2005 | Kamiyama et al. |
| 2005/0058128 A1 | 3/2005 | Carson et al. |
| 2005/0069253 A1 | 3/2005 | Heideman |
| 2005/0141808 A1 | 6/2005 | Cheben et al. |
| 2006/0049826 A1 | 3/2006 | Daneman et al. |
| 2007/0048898 A1 | 3/2007 | Carlson et al. |
| 2007/0242919 A1 | 10/2007 | Welch et al. |
| 2009/0263138 A1 | 10/2009 | Pelley et al. |
| 2009/0263143 A1 | 10/2009 | Pelley et al. |
| 2009/0311819 A1 | 12/2009 | Chang et al. |
| 2010/0236909 A1 | 9/2010 | Biedrzycki et al. |
| 2011/0057306 A1 | 3/2011 | McShane et al. |
| 2011/0317958 A1 | 12/2011 | Nadeau et al. |
| 2012/0051695 A1 | 3/2012 | Harada et al. |
| 2012/0058616 A1 | 3/2012 | Ahn et al. |
| 2012/0104389 A1* | 5/2012 | Whitbread et al. ............. 257/48 |
| 2012/0183009 A1 | 7/2012 | Adachi et al. |
| 2012/0324156 A1 | 12/2012 | Muralimanohar et al. |
| 2013/0039614 A1 | 2/2013 | Shubin et al. |
| 2013/0272337 A1 | 10/2013 | Tan et al. |
| 2014/0362425 A1 | 12/2014 | Stephens et al. |
| 2014/0363119 A1 | 12/2014 | Stephens et al. |
| 2014/0363120 A1 | 12/2014 | Stephens et al. |
| 2014/0363124 A1 | 12/2014 | Pelley et al. |
| 2014/0363153 A1 | 12/2014 | McShane et al. |
| 2014/0363172 A1 | 12/2014 | Pelley et al. |
| 2015/0253511 A1 | 9/2015 | Pelley |

OTHER PUBLICATIONS

Ollier, Eric, Optical MEMS Devices Based on Moving Waveguides, IEEE Journal on Selected Topics in Quantum Electronics, vol. 8, No. 1, Jan./Feb. 2002, p. 155-162.
Baets, R. et al., Silicon Photonics, IEEE 2007, 3 pages.
Bisaillon, E. et al., Free-Space Optical Link with Spatial Redundancy for Misalignment Tolerance, IEEE Photonics Technology Letters, vol. 14, No. 2, Feb. 2002, pp. 242-244.
Bowers, John E. et al., Hybrid Silicon Evanescent Laser on a Silicon-on-Insulator Waveguide, 2006, 3 pages.
Siebel, U. et al., Crosstalk-Enhanced Polymer Digital Optical Switch Based on a W-Shape, IEEE Photonics Technology Letters, vol. 12, No. 1, Jan. 2000, pp. 40-41.
Paniccia, Mario, Intel Corporation, First Electrically Pumped Hybrid Silicon Laser, UCSB Engineering Insights, Oct. 18, 2006, 27 pages.
Paniccia, Mario, Intel Corporation, First Electrically Pumped Hybrid Silicon Laser, UCSB Engineering Insights, http://www.intel.com/content/dam/www/public/us/en/documents/technology-briefs/intel-labs-hybrid-silicon-laser-announcement.pdf, Sep. 18, 2006, 27 pages.
Samara-Rubio, Dean et al., Customized Drive Electronics to Extend Silicon Optical Modulators to 4 Gb/s, IEEE Journal of Lightwave Technology, vol. 23, No. 12, Dec. 2005 , pp. 4305-4314.
Johnson, R. Colin, Intel demos 40-Gbit/s Silicon Laser, Aug. 22, 2007, 1 page.
RP Phototonics, Beam Splitters, http://www.rp-phototonics.com/beam_splitters.html, printed May 13, 2013, 4 pages.
computer weekly.com, IBM debuts prototype terabit optical chip "Holey Optochip," http://www.computerweekly.com/news/2240146552/IBM-unveils-prototype-terabit-optcal-chip, Mar. 8, 2012, 1 page.
A.N. Udipi et al., Combining Memory and a Controller with Photonics through 3D-Stacking to Enable Scalable and Energy-Efficient Systems, ISCA Jun. 4-8, 2011 http://www.cs.utah.edu/~rajeev/pubs/isca11.pdf, 12 pages.
D. Vantrease et al., Corona: System Implications of Emerging Nanophotonic Technology, ISCA '08 Proceedings of the 35th Annual International Symposium on Computer Architecture, pp. 153-164 http://pages.cs.wisc.edu/~danav/pubs/papers/isca08_corona.pd, 12 pages.
R. Goodwins, Inside Intel's 50 Gbps silicon optics, Jul. 27, 2010, printed Mar. 21, 2013 http://www.zdnet.com/inside-intels-50gbps-silicon-optics-3040089657/, 5 pages.
P. Ramm et al., Through Silicon Via Technology—Process and Reliability for Wafer-Level 3D System Integration, IEEE 2008 Electronic Components and Technology Conference, pp. 841-846.
M. Lapedus, Semiconductor Manufacturing & Design Community, Options and Hurdles Come into Focus for 3D Stacking, http://semimd.com/blog/2012/05/29/6210/, printed May 13, 2013, 8 pages.
C. Strandman et al., Fabrication of 45-degree Mirrors Together with Well-Defined V-Grooves Using Wet Anisotropic Etching of Silicon, IEEE Journal of Microelectromechanical Systems, vol. 4, No. 4, Dec. 1995, pp. 213-219.

(56) References Cited

OTHER PUBLICATIONS

M. Immonen et al., Fabrication and Characterization of Polymer Optical Waveguides with Integrated Micromirrors for Three-Dimensional Board-Level Optical Interconnects, IEEE Transactions on Electronics Packaging Manufacturing, vol. 28, No. 4, Oct. 2005, pp. 304-311.

K-W Lee et al., 3D Heterogeneous Opto-Electronic Integration Technology for System-on-Silicon (SOS), 2009 IEEE International Electron Devices Meeting (IEDM), Dec. 7-9, 2009, pp. 531-534.

J. Brouckaert et al., Thin-Film III-V Photodetectors Integrated on Silicon-on-Insulator Photonic ICs, IEEE Journal of Lightwave Technology, vol. 25, No. 4, Apr. 2007, pp 1053-1060.

RP Photonics, Dielectric Coatings, http://www.rp-phototonics.com/dielectric_coatings.html, printed Apr. 16, 2013, 7 pages.

RP Photonics, Dielectric Mirrors, http://www.rp-phototonics.com/dielectric_mirrors.html, printed Apr. 16, 2013, 5 pages.

Shen, Po-Kuan, et al., "SOI-based trapezoidal waveguide with 45-degree microreflector for non-coplanar light bending", Silicon Phototonics VII, Proceedings of SPIE, vol. 8266, Feb. 9, 2012, pp. 1-7.

Civitci, F., et al., "Light Turning Mirrors for Hybrid Integration of Optical Waveguides in SiON Technology and CMOS based Photodetectors", Lasers and Electro-Optics Europe (CLEO Europe/EQEC), 2011 Conference on and 12th European Quantum Electronics Conference, Munich, May 22-26, 2011, 1 page.

\* cited by examiner

OPTICAL WAFER AND DIE PROBE TESTING

CROSS-REFERENCE TO RELATED APPLICATIONS

U.S. patent application Ser. No. 13/914,021 entitled "Die Stack with Optical TSVS," by inventors Perry H. Pelley, Tab A. Stephens, and Michael B. McShane, filed Jun. 10, 2013, describes exemplary methods and systems and is incorporated by reference in its entirety.

U.S. patent application Ser. No. 13/914,049, entitled "Communication System Die Stack," by inventors Tab A. Stephens, Perry H. Pelley, and Michael B. McShane, filed Jun. 10, 2013, describes exemplary methods and systems and is incorporated by reference in its entirety.

U.S. patent application Ser. No. 13/914,089, entitled "Integration of a MEMS Beam with Optical Waveguide and Deflection in Two Dimensions," by inventors Tab A. Stephens, Perry H. Pelley, and Michael B. McShane, filed Jun. 10, 2013, describes exemplary methods and systems and is incorporated by reference in its entirety.

U.S. patent application Ser. No. 13/914,123, entitled "Method and Apparatus for Beam Control with Optical MEMS Beam Waveguide," by inventor Perry H. Pelley, filed Jun. 10, 2013, describes exemplary methods and systems and is incorporated by reference in its entirety.

U.S. patent application Ser. No. 13/914,149, entitled "Optical Redundancy," by inventors Perry H. Pelley, Tab A. Stephens, and Michael B. McShane, filed Jun. 10, 2013, describes exemplary methods and systems and is incorporated by reference in its entirety.

U.S. patent application Ser. No. 13/914,178, entitled "Optical Backplane Mirror," by inventors Tab A. Stephens, Perry H. Pelley, and Michael B. McShane, filed Jun. 10, 2013, describes exemplary methods and systems and is incorporated by reference in its entirety.

U.S. patent application Ser. No. 13/914,199, entitled "Optical Die Test Interface," by inventors Michael B. McShane, Perry H. Pelley, and Tab A. Stephens, filed Jun. 10, 2013, describes exemplary methods and systems and is incorporated by reference in its entirety.

BACKGROUND OF THE INVENTION

1. Field of the Invention

The present invention is directed in general to semiconductor devices and methods for manufacturing same. In one aspect, the present invention relates to testing integrated circuits.

2. Description of the Related Art

Integration of optical communication systems into integrated circuit (IC) chip devices is considered a promising solution for overcoming physical limitations in high-frequency, high-density information systems. In addition, a number of optical chip-to-chip interconnect systems have been proposed to provide efficient signal coupling between optical communication systems at different IC chip devices. But with any integrated circuit technology, there are technical difficulties and challenges posed by fabricating such devices, including but not limited to lower yield rates that can result from manufacturing defects that can occur, especially as device geometries shrink, device performance increases, and fabrication technologies advance. These challenges can be compounded when optical communication systems, such as optical micro-electro-mechanical systems (MEMS) circuits and devices, are included in the IC chip devices. While there are various wafer probe tests that may be performed throughout the manufacture of semiconductor devices to detect errors and defects prior to packaging the individual semiconductor die, such tests typically require that each die be separately probed on a tester. In addition, probe testing of integral wafer-contained circuit die for electrical properties has not been successfully extended to testing of electro-optical devices due to a number of challenges posed by generating, delivering, and processing optical test signals, as well as the additional die size requirements imposed by including optical test circuitry in the individual die. As a result, the existing solutions for testing optical communication systems within IC chip devices are extremely difficult at a practical level.

BRIEF DESCRIPTION OF THE DRAWINGS

The present invention may be understood, and its numerous objects, features and advantages obtained, when the following detailed description is considered in conjunction with the following drawings, in which.

Figure 1:
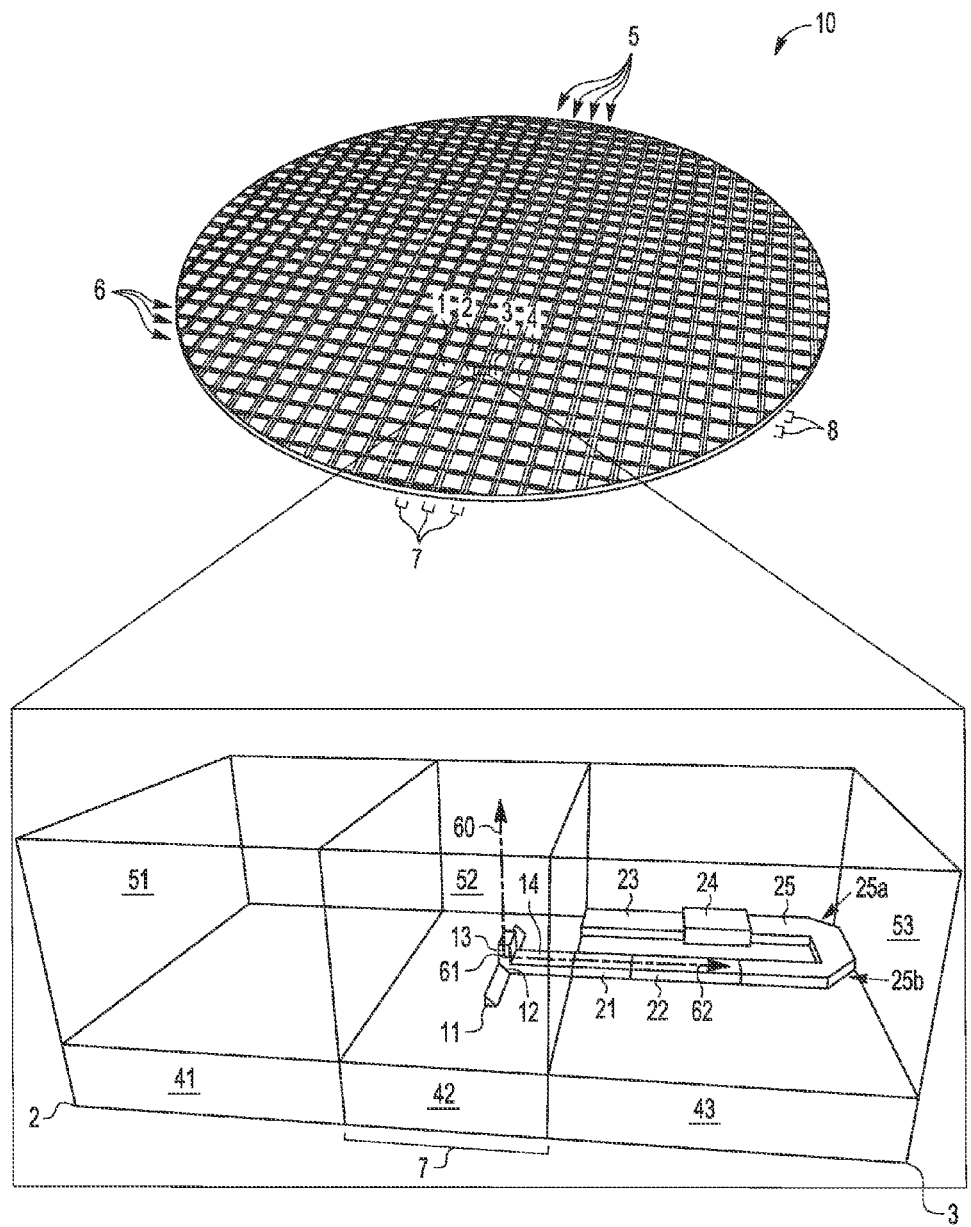
FIG. 1 illustrates a perspective view of a wafer with an enlarged, detailed view showing optical die test interface features located in a scribe street for die testing of selected MEMS optical beam waveguide and interconnect features on a die.

It will be appreciated that for simplicity and clarity of illustration, elements illustrated in the drawings have not necessarily been drawn to scale. For example, the dimensions of some of the elements are exaggerated relative to other elements for purposes of promoting and improving clarity and understanding. Further, where considered appropriate, reference numerals have been repeated among the drawings to represent corresponding or analogous elements.

DETAILED DESCRIPTION

There is disclosed herein an improved optical die test interface and associated die probe test arrangement and methodology, for testing high density, low power, high performance optical communication systems in integrated circuit devices that address various problems in the art where various limitations and disadvantages of conventional solutions and technologies will become apparent to one of skill in the art after reviewing the remainder of the present application with reference to the drawings and detailed description provided herein. In selected embodiments, a system, method and apparatus are described for fabricating one or more mirror structures (e.g., 45 degree mirrors) in the scribe areas around each die on a wafer to perform wafer level tests of optical and composite die. By using silicon orientation-dependent wet etch processes to perform silicon micromachining, 45 degree mirror structures may be fabricated in the scribe street or grid area to perpendicularly deflect optical into and out of the lateral plane of the die (or test die). Upon completion of wafer fabrication, selected die tests may be performed on a die by using a partial saw cut to reveal a die edge waveguide and associated scribe street mirror structure. By including a stabilization structure around the die edge waveguide that may be removed and replaced, lateral access to the die is protected during testing. In addition, the scribe street mirror structures may be removed during final wafer sawing and singulation. Optical wafer die probe testing may be performed by mounting a test head with an optical test integrated circuit including a test die and associated scribe street mirror structures so that optical test signals from the test die can be directed through the street mirror structures to the wafer and die under test so that light beams from the test die and package at the test head will match exactly the mirrors on the device under test.

In this disclosure, an improved system, apparatus, and fabrication method are described for fabricating and using optical die test interface structures to include scribe street mirror structures for reflecting optical test signals perpendicularly into and from the lateral plane of the die under test, thereby addressing various problems in the art where various limitations and disadvantages of conventional solutions and technologies will become apparent to one of skill in the art after reviewing the remainder of the present application with reference to the drawings and detailed description provided herein. Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross sectional drawings of a semiconductor device without including every device feature or geometry in order to avoid limiting or obscuring the present invention. Such descriptions and representations are used by those skilled in the art to describe and convey the substance of their work to others skilled in the art. In addition, although specific example materials are described herein, those skilled in the art will recognize that other materials with similar properties can be substituted without loss of function. It is also noted that, throughout this detailed description, certain materials will be formed and removed to fabricate the optical die test interface structures and associated waveguide beams. Where the specific procedures for forming or removing such materials are not detailed below, conventional techniques to one skilled in the art for growing, depositing, removing or otherwise forming such layers at appropriate thicknesses shall be intended. Such details are well known and not considered necessary to teach one skilled in the art of how to make or use the present invention.

FIG. 1 illustrates a perspective view of a semiconductor wafer 10 having a plurality of die (e.g., 1-4) arranged in rows (e.g., 5) and columns (e.g., 6) which are separated from one another by rows and columns of scribe street or grid lines 7-8. At the wafer stage of manufacture, each die (e.g., 3) may include not only electrical circuitry, but also MEMS optical beam waveguide, optical circuit element, and/or interconnect features formed in a horizontal die plane at a connection interface between the die and an adjacent scribe line 7. At the same connection interface, one or more optical die test interface structures are formed in a horizontal scribe plane. The relative orientation of the horizontal die and scribe planes creates challenges in fabricating mirror structures to perpendicularly deflect optical signals in and out of the horizontal planes.

As described more fully hereinbelow with the reference to the enlarged detailed view of the connection interface at the scribe area 7 between adjacent die 2, 3, each die (e.g., 3) includes various electrical and optical circuit structures, such as MEMS optical beam waveguide and interconnect features 21-25. As illustrated, the optical features are formed over an underlying substrate structure 41-43 which includes at least a semiconductor substrate layer (not shown), where the substrate structure regions 41 and 43 form part of the adjacent die 2, 3, respectively, and the substrate structure region 42 forms part of the scribe area 7. The substrate structure regions 41-43 are covered by one or more integrated circuit layers 51-53 (e.g., passivation or dielectric layers and/or other semiconductor or conductor features), where the IC layer regions 51 and 53 form part of the adjacent die 2, 3, respectively, and the IC layer region 52 forms part of the scribe area 7. For example, one or more deflectable MEMS optical beam waveguides 21 (e.g., hundreds per die edge) may be formed at an edge of the integrated circuit die 3 to include multiple deflection electrodes positioned on and around each MEMS optical beam waveguide to provide two-dimensional deflection for aligning communications over an optical link 60 routed to or from the die 3. Though the waveguide(s) 21 may be connected to any desired optical elements in the die 3 (such as light detector, modulator, optical receiver, etc.), for purposes of illustration, a waveguide structure 22 is shown as connecting the deflectable MEMS optical beam waveguide 21 with a linear optical signal path 62 into and/or out of the die 3. For example, the waveguide structure 22 may be optically connected by a routing silicon waveguide 25, which in turn is connected to an optical circuit element 24 (e.g., laser transmitter, light detector, modulator, optical receiver, etc.) and additional silicon waveguide 25 for processing and/or conveying optical signal information in the integrated circuit die 3. As illustrated, the silk on waveguides (e.g., may include one or more in-plane mirror surfaces (e.g., 25a, 25b) to provide optical signal deflection points for any optical signal conveyed in the waveguide. As will be appreciated, each of the in-plane mirror surfaces 25a, 25b may be fabricated with a relatively straightforward process of forming a mask of photo resist or other masking material (not shown) over a silicon waveguide layer which defines the 45-degree angle features 25a, 25b, and then removing any unprotected portions with an appropriate anisotropic etch process. Though not shown, it will be appreciated that electrical and optical circuit structures, such as MEMS optical beam waveguide and interconnect features, may also be formed in the adjacent die (e.g., 2) over an underlying substrate structure 41 which is covered by one or more integrated circuit layers 51.

In the scribe street or grid line area (e.g., 7) separating adjacent die (e.g., one or more optical die test interface structures 11-14 with mirror structures 11-12 are formed for use in deflecting optical test signals perpendicularly into and from the lateral plane of the die under test. As illustrated, the scribe street area 7 includes one or more mirror structures 11-12 and waveguide beams 13-14 for providing an optical signal path 60-62 in and through the integrated circuit die 3. As described more fully below, the scribe street mirror structure(s) 11-12 are formed over an underlying substrate structure 42 which includes at least a semiconductor substrate layer (not shown), and which is covered by one or more integrated circuit layers 52 (e.g., passivation or dielectric layers and/or other semiconductor or conductor features). As formed, the scribe street mirror structure(s) 11-12 may include a 45-degree deflection surface 12 to deflect an out-of-plane optical signal 60 into and out of the horizontal plane of the die 3 at deflection point 61. In selected embodiments described more fully hereinbelow, each scribe street mirror structure 11-12 may be fabricated by forming a semiconductor-on-insulator (SOI) semiconductor layer 11 over the substrate structure 42, and then selectively applying one or more angled silicon etch processes to define an etched silicon feature that may be oxidized in whole or in part to form a reflective oxide mirror structure 12 from the SOI semiconductor layer 11. Alternatively, the scribe street mirror structure(s) 11-12 may be formed with a 45-degree half-mirror surface 12 by forming an SOI silicon layer over the substrate structure 42, selectively applying one or more angled silicon etch processes to define an etched feature, and then forming one or more mirror layers on the etched silicon feature to form a half-mirror structure 11-12.

With the depicted mirror structure(s) 11-12, an optical signal 60 perpendicular to the horizontal plane of the wafer is received in a vertical component of the waveguide beam 13, and is deflected perpendicularly at deflection point 61 by the 45-degree mirror surface 12 of the scribe street mirror structure 11. The deflected optical signal 62 may then proceed through a horizontal component of the waveguide beam 21 and to the integrated circuit die 3. Though not shown, one or more additional scribe street mirror structures may be formed in the scribe street area 7 to receive an optical signal in the horizontal plane of the die and deflect the received signal perpendicularly to proceed perpendicularly out of the horizontal plane of the die 3.

To illustrate selected embodiments of a fabrication and testing sequence, reference is now made to FIGS. 2-10 which illustrate partial cutaway side views of various stages in the production and testing of an integrated circuit optical die test interface using one or more embedded scribe street mirrors for transitioning optical signals perpendicularly to the plane of the die under test. Though the various structures, openings, recesses, and layer regions are illustrated in simplified form with straight lines and corner regions, it will be appreciated that the actual profile(s) for the different structures, openings, recesses, and layer regions will not necessarily conform to simplified depictions, but will instead depend on the specific fabrication process(es) used. For example, selected etch processes may result in curved corner profiles or undercut features. In addition, certain epitaxial or thermal oxidation processes may alter the profile of the resulting layers, depending on a variety of processing factors.

Figure 2:
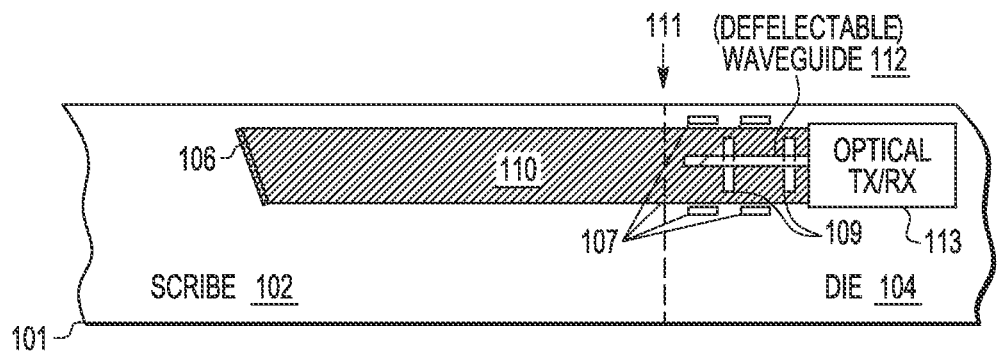
FIGS. 2-9 illustrate partial cutaway side views of various stages in the production and testing of an integrated circuit optical die test interface using an embedded scribe street mirror according to selected example embodiments of the present disclosure.

Referring first to FIG. 2, there is shown in simplified schematic form a partial cutaway side view of a semiconductor wafer structure 101 formed with a plurality of substrate layers (e.g., a substrate, buried oxide, semiconductor layer, and dielectric layers) to define a deflecting mirror and deflectable waveguide structure in a scribe street die area 102. Using the same processing steps, the plurality of substrate layers may be used to define a deflectable die edge waveguide beam and associated optical circuit element in a die area 104. Without belaboring the details, it will be appreciated that the semiconductor wafer structure 101 includes a substrate (not shown) that may be formed with monocrystalline silicon, though other materials may be used, such as a bulk semiconductor substrate, semiconductor-on-insulator (SOI) type substrate, epitaxially grown semiconductor layer(s), or any semiconductor material including, for example, Si, SiC, SiGe, SiGeC, Ge, GaAs, InAs, InP, as well as other III/V or II/VI compound semiconductors or any combination thereof. On the substrate, an oxide layer or other dielectric material (not separately shown) may be formed by depositing or thermally growing one or more silicon oxide layers to form a buried oxide layer having a predetermined thickness, such as by depositing a buried oxide layer of silicon dioxide with a chemical vapor deposition (CVD) or thermal deposition over the semiconductor wafer structure, followed by a planarization (e.g., a chemical mechanical polish (CMP)). On the oxide layer, a silicon substrate layer (not separately shown) is formed, such as be epitaxially growing or bonding a monocrystalline silicon layer or polysilicon layer using any desired CVD or thermal deposition process to a predetermined thickness which is controlled to define the subsequently formed in-plane optical beam structure. However, in selected embodiments, the silicon substrate layer may be formed with a layer of silicon having a predetermined crystallographic orientation (e.g., <100> or <110>). As will be appreciated, the plurality of substrate layers may be formed as a semiconductor-on-insulator (SOI) substrate wafer structure in which the silicon substrate layer and underlying substrate layer are bonded together to include a buried oxide layer.

Though schematically shown in simplified cross-sectional form in FIG. 2, it will be appreciated that the semiconductor wafer structure 101 may be fabricated with any desired semiconductor processing steps to include a scribe area portion 102 and a die area portion 104. In the scribe area portion 102, an embedded scribe street mirror structure 106 is formed, in addition, one or more deflectable MEMS optical waveguide beams 112 and associated optical element(s) 113 (e.g., light detector, modulator, optical receiver, optical transmitter, etc.) are formed in the die area portion 104. As formed, the deflectable MEMS optical waveguide beam 112 is positioned within a stabilization structure or material 110 formed in a deflection cavity that connects the waveguide beam 112 to the final die edge 111. While any desired material may be used for the stabilization structure 110, in selected embodiments, the stabilization structure 110 is formed by injecting or depositing a layer of sacrificial material (e.g., polymer material which may be removed by dry ashing, such as an oxygen plasma, or wet etch like Piranha chemistry) having structural properties to fill the deflection cavity and surround the waveguide beam 112 to prevent movement thereof, but also having etch properties to permit selective or controlled etching or partial removal of the stabilization structure 110. Around the MEMS optical beam waveguide(s) 112, the semiconductor processing steps may also be used to form a plurality of deflection electrodes 107/109 to provide two-dimensional deflection for aligning communications over an optical link between the optical beam waveguide 112.

Example semiconductor processing steps to form the embedded scribe street mirror structure 106 and waveguide beam 112 include formation of the silicon substrate layer, selective patterning of oxide layers on the silicon substrate layer to form etch masks, directional silicon etching of the silicon substrate layer (e.g., with a silicon orientation-dependent wet etch process) that uses the etch masks to form angled silicon mirror surfaces, selective local oxidation of angled silicon mirror surfaces and/or formation of one or more dielectric mirror layers on the angled silicon mirror surfaces, and epitaxial silicon regrowth from the angled silicon mirror surfaces to form horizontal and vertical components of the embedded mirror structures. For additional details on semiconductor processing steps that may be used to fabricate the embedded scribe street mirror structure 106 and waveguide beam 112, reference is now made to U.S. patent application Ser. No. 13/914,178 (entitled "Optical Backplane Mirror" and filed Jun. 10, 2013) which is incorporated by reference as if fully set forth herein. Though described with reference to selected optical backplane die embodiments, it will be appreciated that the fabrication process steps described in the "Optical Backplane Mirror" application can also be used to form the embedded scribe street mirror structures disclosed herein.

To provide two-dimensional deflection control for aligning communications over an optical link between the optical beam waveguide 112, multiple deflection electrodes are formed around the MEMS optical beam waveguide 112 so that different voltages can be applied to the deflection electrodes to exert deflection forces on the waveguide 112. For example, a first plurality of separate electrodes 109 may be formed on opposite sides of each MEMS waveguide beam structure 112 in order to exert lateral deflection force thereon. And to provide a vertical deflection forces, a plurality of separate electrodes 107 are formed above and/or below each MEMS optical beam waveguide 112. By using separate electrodes 107, 109 alongside the optical MEMS optical beam waveguide 112 that may be independently controlled with different voltages, two-dimensional alignment control may be provided in both x (lateral) and y (vertical) directions to provide fine steering control for aligning optical communication signals. Example semiconductor processing steps to form the deflection electrodes 107, 109 on and around the MEMS optical beam waveguide 112 include formation of the silicon substrate layer, selective patterning of oxide layers on the silicon substrate layer to form etch masks, anisotropic etching of the silicon substrate layer using the etch masks to form MEMS optical beam waveguides and associated lateral deflection electrodes, formation of encapsulation waveguide structures within the deflection cavity, and formation of silicided deflection electrodes around the beam waveguide(s). For additional details on semiconductor processing steps that may be used to fabricate the deflection electrodes formed around the MEMS optical beam waveguide 112, reference is now made to U.S. patent application Ser. No. 13/914,089 (entitled "Integration of a MEMS Beam with Optical Waveguide and Deflection in Two Dimensions" and filed Jun. 10, 2013) which is incorporated by reference as if fully set forth herein. Though described with reference to selected die stack module embodiments, it will be appreciated that the fabrication process steps described in the "Integration of a MEMS Beam with Optical Waveguide and Deflection in Two Dimensions" application can also be used to form the deflection electrodes 107, 109 and optical MEMS optical beam waveguide 112 shown in FIG. 2.

Figure 3:
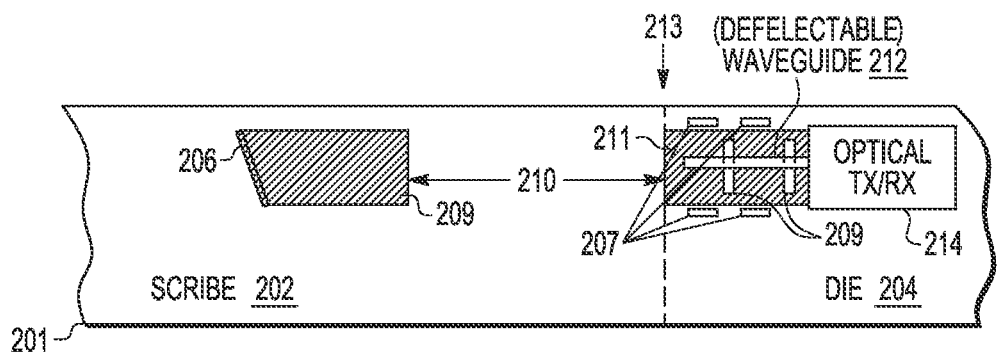

As an alternative embodiment, FIG. 3 shows that the semiconductor wafer structure 201 may be fabricated to include a scribe area portion 202 (with an embedded scribe street mirror structure 206) and die area portion 204 (with an optical element 214 and deflectable MEMS optical waveguide beam 212 having deflection electrodes 207, 209) separated by a final die edge 213. But instead of forming the deflectable MEMS optical waveguide beams 212 to be connected by a single, continuous stabilization structure 110 (as shown in FIG. 2), the semiconductor wafer structure 201 includes first and second stabilization structures 209, 211 formed in separate deflection cavities separated from one another by a gap 210. The placement and spacing of the gap dimensions 210 are controlled to account for subsequent processing steps for revealing the deflectable MEMS optical waveguide beams 212 described hereinbelow.

Referring back to FIG. 2, once the semiconductor wafer structure 101 is constructed with mirror structure 106 in the scribe grid area 102, additional processing steps are applied to test optical circuits in the die area portion 104 by generating optical test signals to test both electrical and optical functions in the die area portion 104. In this testing configuration, optical test signals are deflected off the scribe grid mirror structure 106 and into the deflectable MEMS optical beam waveguide 112 formed in the die area portion 104 to provide lateral access to optical circuits in the die area portion 104.

Figure 4:
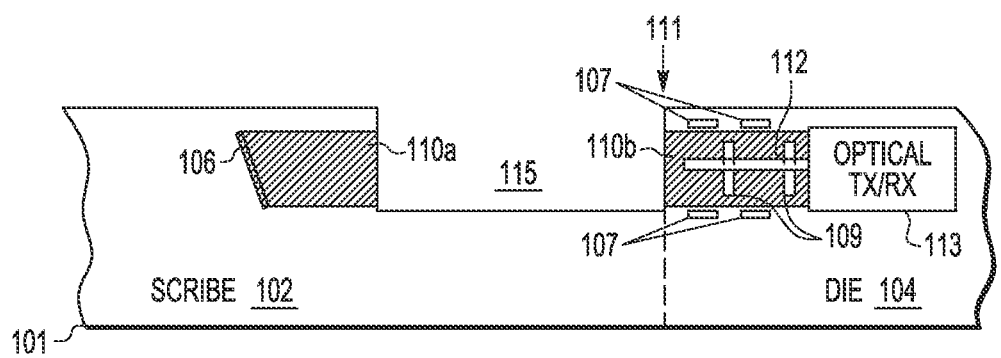
Figure 5:
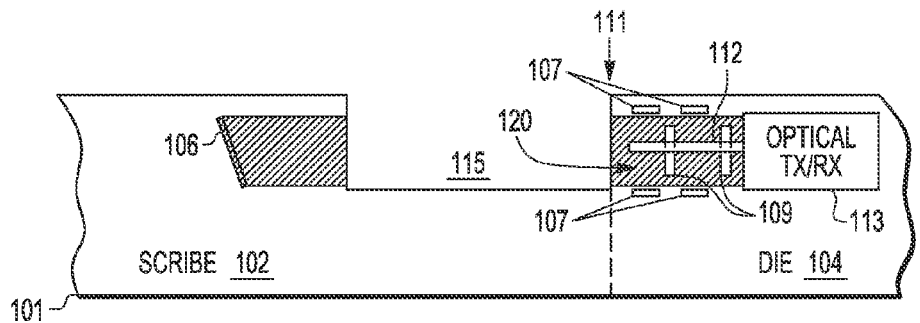

As a preliminary step for generating optical test signals, the deflectable MEMS optical beam waveguide 112 is at least substantially revealed at the die edge 111 by selectively removing a portion of the semiconductor wafer structure 101. To illustrate an example embodiment, FIG. 4 illustrates processing of the semiconductor wafer structure 101 subsequent to FIG. 2 with a partial cutaway side view after a recess opening 115 is formed in the semiconductor wafer structure 101. As shown, the recess opening(s) 115 may be produced by sawing or etching (e.g., with a dry etch process) a portion of the semiconductor wafer structure 101 to define a predetermined pattern of recessed features which extend only partially through the semiconductor wafer structure 101, though other techniques may be used. In selected embodiments, a first partial etch or saw process may be applied to a patterned etch mask layer of photoresist formed on the upper surface of the semiconductor wafer structure 101, where the partial etch/saw process is controlled to partially etch the recess opening (s) 115 having a lateral dimension between the unetched stabilization structure 110b which completely exposes the distal end of waveguide beam 112. In other embodiments, the lateral dimension of the opening 115 is controlled to leave a portion of the stabilization structure 110b as a protective covering on the distal end of waveguide beam 112 (as shown in FIG. 4). Thus, the lateral dimension of the recess opening (s) 115 determines the extent to which the distal end of waveguide beam 112 exposed. The first partial etch or saw process may also be controlled to partially etch the recess opening(s) 115 having a depth dimension that fully exposes the unetched stabilization structures 110a, 110b. Though not shown, it will be appreciated that the recess opening(s) 115 may be formed as a criss-crossing pattern of separate or continuous, partially etched recess openings on the semiconductor wafer structure 101 that are formed in alignment with the intended die edges 111 at the final singulation cut lines.

With the stabilization structures 110a, 110b still in place, the MEMS optical waveguide beam 112 is not deflectable or movable, so at this point, the stabilization structures 110a, 110b must be removed from around the waveguide beam 112 to allow additional wafer function tests to be performed. To illustrate an example embodiment, reference is now made to FIG. 5 which illustrates processing of the semiconductor wafer structure 101 subsequent to FIG. 4 with a partial cutaway side view after removal of one or more of the stabilization structures 110a, 110b, thereby forming an open deflection cavity 120 around at least the waveguide beam 112. As illustrated, the stabilization structures 110a (covering mirror 106) and 110b (around the waveguide beam 112) may be removed by applying one or more selective etch processes (e.g., a wet etch of Piranha or a dry ash of oxygen or reactive plasma, in the selected embodiments where the stabilization structure 110 is a polymer material) which removes the stabilization structures 110a, 110b, thereby exposing the waveguide beam 112 in the die area portion 104 and the mirror 106 in scribe area 102.

Figure 6:
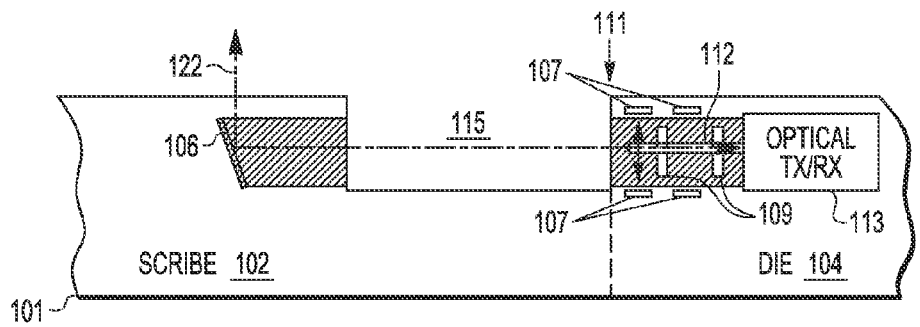

Once the stabilization structure(s) 110a, 110b are removed to release the waveguide beam 112, one or more wafer function tests may be performed. To illustrate an example embodiment, FIG. 6 illustrates processing of the semiconductor wafer structure 101 subsequent to FIG. 5 with a partial cutaway side view after an optical test signal 122 is supplied to or received from the die area portion 104. As illustrated, an optical test signal 122 may be provided to the wafer 101 in a vertical plane. At the embedded scribe street mirror structure 106, the received optical test signal 122 is deflected perpendicularly into the lateral plane of the semiconductor wafer structure 101. The deflected optical signal 122 may then proceed to the MEMS optical waveguide beam 112 and to the optical element 113 in the die area portion 104. As will be appreciated, electrical signals for activating the die 104 for test could be supplied conventionally with microprobes arranged to not interfere with optical test signal 122.

As indicated by the direction arrows at both ends of the optical test signal 122, the wafer function tests may also require the generation of optical test signals 122 by one or more optical elements 113 in the die area portion 104 which are transmitted by the MEMS optical waveguide beam 112 and into the lateral plane of the semiconductor wafer structure 101 for reception at the mirror 106. At the embedded scribe street mirror structure 106, the received optical test signal 122 is deflected perpendicularly out of the plane of the semiconductor wafer structure 101 where it may proceed to external testing equipment. Likewise, an optical test signal 122 may be received at mirror 106 to be reflected into the MEMS optical waveguide beam 112 to be received by one or more optical elements 113. Therefore, optical beam 122 may be used for sending and/or receiving of test information with regard to die 101. In selected embodiments, each of the optical elements 113 include both transmitters and receivers, even when the optical element(s) 113 will be only receivers in normal operation, in order to test all of the MEMS optical waveguide beams 112.

Examples of such optical tests include, but are not limited to, electrical open and short test and light beam transfer tests, testing of optical waveguides and optical components, testing of electrical signals and the interaction of electrical signals at least at the electrical interface to optical transmitters and receivers at the die 104. Optical testing may also include testing; of electrical functionality and movement of the beam waveguides. More generally, testing of the MEMS optical waveguide beams can proceed by deflecting the MEMS optical waveguide beams vertically or horizontally (or both vertically and horizontally) and then measuring the attenuation of the optical test signal 122 as a function of various deflections. In this manner, a partial test of the MEMS optical waveguide beams and the associated control circuitry may be accomplished. As a result of testing, any identified non-functional MEMS optical waveguide beams locations may be recorded for later replacement.

Figure 7:
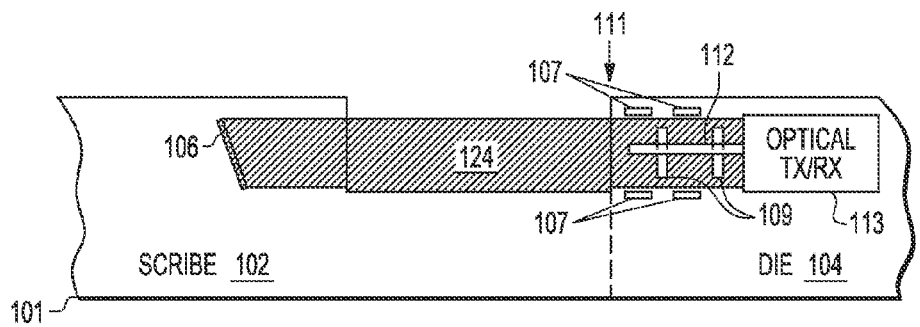

Once any wafer level testing is completed, singulation processing is applied to separate individual die from the semiconductor wafer structure 101. As a preliminary step, any exposed deflectable MEMS optical beam waveguide 112 is stabilized by forming a stabilization structure or material 124. To illustrate an example embodiment, FIG. 7 illustrates processing of the semiconductor wafer structure 101 subsequent to FIG. 6 with a partial cutaway side view after a stabilization structure 124 is formed in the semiconductor wafer structure 101. While any desired process may be used to form the stabilization structure 121, in selected embodiments, a sacrificial layer of stabilization material (e.g., a polymer material which may be removed by dry ashing, such as an oxygen plasma, or wet etch like Piranha chemistry) is injected or deposited to fill at least the recess opening(s) 115 and surround the waveguide 112, followed by an optional planarization or chemical mechanical polish (CMP) step. In other embodiments, the stabilization structure or material 124 is formed to protect and stabilize the MEMS optical beam waveguide 112 against movement by at least partially filling the recess opening(s) 115.

Figure 8:
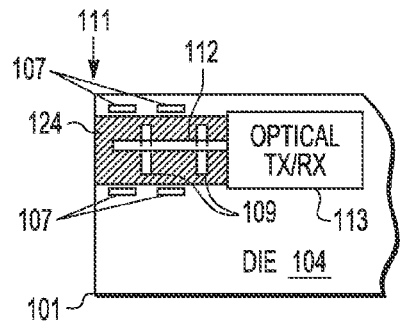
Figure 9:
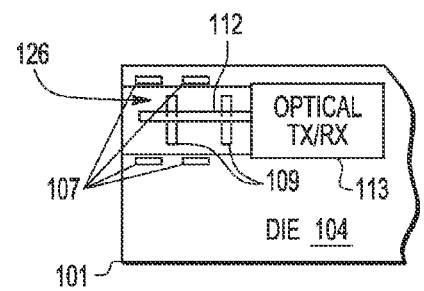

Subsequent to forming the stabilization structure 124, individual integrated circuit die are singulated from the semiconductor wafer structure 101 with a singulation process, such as by applying a saw along the die edge lines 111. To illustrate an example embodiment, FIG. 8 illustrates processing of the semiconductor wafer structure 101 subsequent to FIG. 7 with a partial cutaway side view after singulation of the die area portion 104. By virtue of reforming the stabilization structure 124 prior to singulation, the cutting process does not damage the deflectable MEMS optical waveguide beam 112. However, after singulation, the stabilization structure 124 is removed to release the waveguide beam 112 to enable full deflection movement and control thereof. To illustrate an example embodiment, FIG. 9 illustrates processing of the semiconductor wafer structure 101 subsequent to FIG. 8 with a partial cutaway side view after the stabilization structure 124 is removed to form an open deflection cavity 126 around the waveguide beam 112. As illustrated, the stabilization structure 124 around the waveguide beam 112 may be selectively removed by applying one or more selective etch processes (e.g., a wet etch of Piranha or a dry ash of oxygen or reactive plasma, in the selected embodiments where the stabilization structure 124 is a polymer material) which selectively removes the stabilization structure 124, thereby exposing the waveguide beam 112 in the deflection cavity 126 of the die area portion 104.

Figure 10:
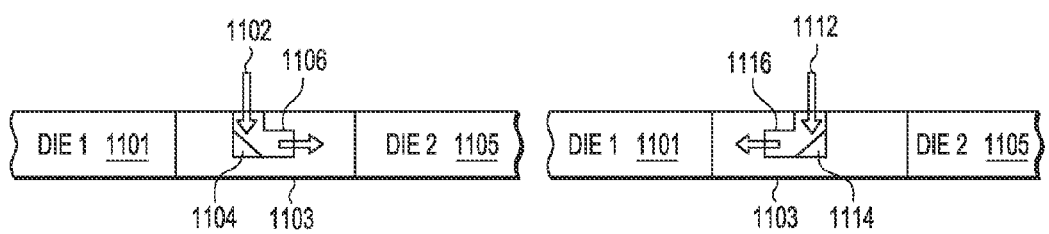
FIGS. 10-11 show example partial cutaway side views of different embedded mirror locations in a scribe street or grid areas of a wafer.

As described herein, optical die test interface mirror structures for perpendicularly deflecting optical signals are constructed in the scribe grid area between wafer die using the semiconductor processing steps used to fabricate the optical wave guide and routing structures. In this way, lateral access for wafer-level optical testing is provided without consuming valuable real estate in the integrated circuit die since the mirror structures located in the scribe street are used for pre-singulation testing purposes, and then removed during wafer sawing. Depending on the location of the source and destination of the optical signal and the desired deflection direction, the optical die test interface mirror structures may be positioned and located anywhere within the scribe grid area. For example, FIG. 10 shows partial side views of first and second die (Die 1, Die 2) 1101, 1105 connected in wafer form by a central scribe street region 1103 in which centrally positioned optical die test interface mirror structures are constructed. On the left, the optical die test interface mirror structure 1104, 1106 is centrally positioned in the central scribe street region 1103 to receive the optical signal 1102 for perpendicular deflection into the second die 1105 (e.g., to the right) by the 45 degree mirror structure 1104 and L-shaped optical waveguide beam 1106. In similar fashion, the optical die test interface mirror structure 1114, 1116 shown on the right in FIG. 10 is centrally positioned in the central scribe street region 1103 (though at a different depth location with the central scribe street region 1103) to receive the optical signal 1112, where it is perpendicularly deflected into the first die 1101 (e.g., to the left) by the by the 45 degree mirror structure 1114 and L-shaped optical waveguide beam 1116. Without belaboring the details, the optical die test interface mirror structures 1104/1106, 1114/1116 are positioned and constructed in the scribe area portion 1103 by processing a silicon substrate layer with one or more mask, etch and/or epitaxial silicon growth steps to form an L-shaped optical waveguide beam (e.g., 1106) that is adjacent to a 45 degree mirror structure (e.g., 1104) formed at an interface between one or more dielectric interface layers and an angled silicon etch surface formed with an orientation-dependent silicon wet etch process. Of course, it will be appreciated that the direction of the optical signals 1102, 1112 coming into the optical die test interface mirror structures 1104/1106, 1114/1116 may be reversed to come out of the optical die test interface mirror structures 1104/1106, 1114/1116.

Figure 11:
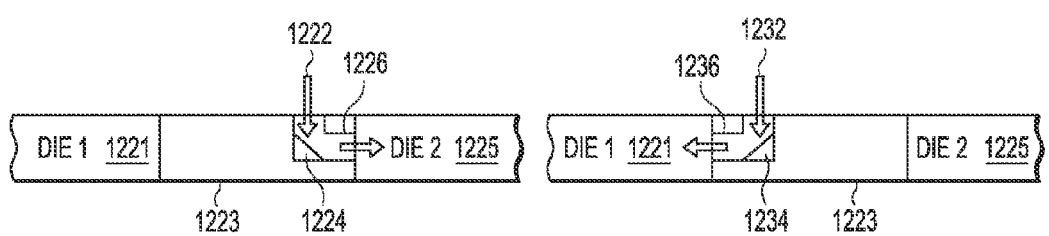

In other embodiments, the optical die test interface mirror structures may be positioned to receive optical signals at the periphery of the scribe grid area. For example, FIG. 11 shows partial side views of first and second die (Die 1, Die 2) 1221, 1225 connected in wafer form by a central scribe street region 1223 in which peripherally positioned optical die test interface mirror structures are constructed. On the left, the optical die test interface mirror structure 1224/1226 is positioned near the interface between the central scribe street region 1223 and the second die 1225. In this position, the optical die test interface mirror structure 1224/1226 perpendicularly deflects the optical signal 1222 into the second die 1225 (e.g., to the right) using the 45 degree mirror structure 1224 and L-shaped optical waveguide beam 1226. In addition, the optical die test interface mirror structure 1234/1236 shown on the right in FIG. 11 is positioned near the interface between the central scribe street region 1223 and the first die 1221 to receive the optical signal 1232, where it is perpendicularly deflected into the first die 1221 (e.g., to the left) by the by the 45 degree mirror structure 1234 and L-shaped optical waveguide beam 1236. Of course, it will be appreciated that the direction of the optical signals 1222, 1232 coming into the optical die test interface mirror structures 1224/1226, 1234/1236 may be reversed to come out of the optical die test interface mirror structures 1224/1226, 1234/1236.

Figure 12:
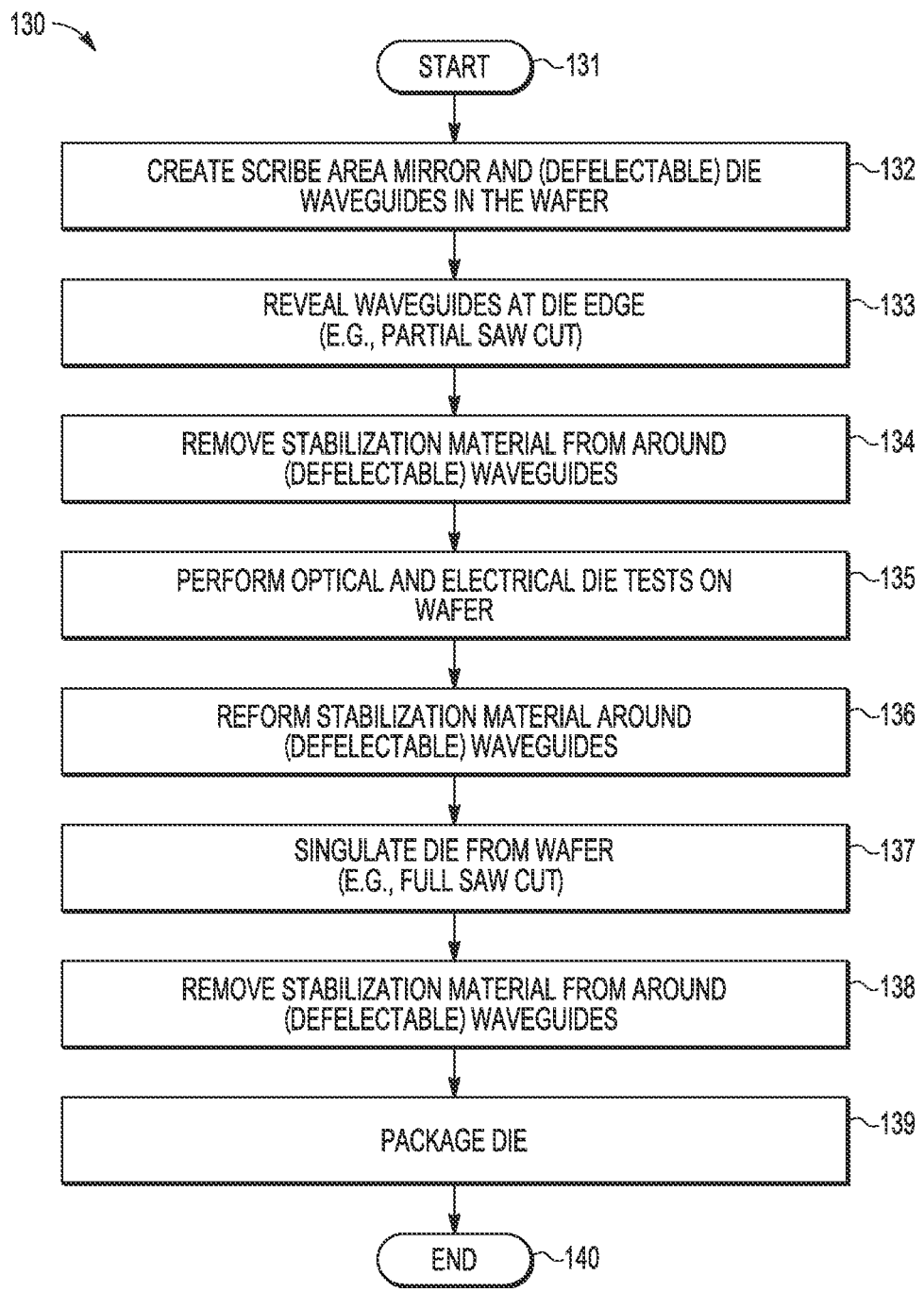
FIG. 12 illustrates an example process flow diagram of an optical die test fabrication and testing sequence according to selected embodiments of the present disclosure.

Turning now to FIG. 12, there is shown a simplified flow chart of a process 130 of an optical die test fabrication and testing sequence. Once the method starts (step 131), a wafer is fabricated (step 132). In the wafer, one or more mirror structures are created or formed in the scribe areas separating individual die. Each mirror structure may be positioned for optical communication with a die edge, and may include a vertical waveguide structure and a horizontal waveguide structure formed in an "L" shape at a dielectric mirror interface layer. By forming the horizontal waveguide structure to be surrounded by a stabilizing material or structure, movement of the horizontal waveguide structure is prevented during subsequent processing. In each die, one or more horizontal waveguide beams are created or formed at die edge locations to include horizontal waveguide structures that are positioned for potential optical communication with a corresponding scribe area mirror structure, such as by fabricating deflectable MEMS waveguide beams with two-dimensional beam deflection electrodes. By forming the horizontal waveguide beam(s) at die edge locations to be surrounded by a stabilizing material or structure, movement of the horizontal waveguide beam(s) is prevented during subsequent processing. Each die may also include vertical through-silicon-vias (TSVs) for communicating optical signals vertically through the die. In addition, each die may include optical feedthroughs (e.g., silicon or oxide beams with encapsulation waveguides) for transmitting optical signals through the die.

At step 133, the horizontal waveguide structures at the die edge are revealed. While any desired process may be used, the horizontal waveguide structures may be revealed by performing a partial saw cut through the wafer to form a recess opening which exposes at least a first horizontal waveguide structure associated with a first scribe area mirror structure, along with a corresponding first horizontal waveguide structure associated with a first die area waveguide beam. In other embodiments, the horizontal waveguide structures may be revealed by selectively applying one or more etch processes to the wafer to form a recess opening. In any case, the process of revealing the waveguide structures with a recess opening may occur without removing the stabilizing material formed around each horizontal waveguide structure.

At step 134, the stabilizing material is removed from at least the horizontal waveguide structures in the die. The removal process may employ one or more selective etch processes, such as by selectively etching the stabilizing material to release the waveguide beams formed in the die. If desired, the horizontal waveguide structures from the scribe area mirrors may also be removed at this stage, or may be protected against removal by forming protective mask layers.

Once the stabilization material is removed, one or more wafer function tests may be performed at step 135 to test any optical circuit elements, including specifically any movements of the deflectable waveguide beams in the die. At this point in the optical die test process, the horizontal waveguide structures in the deflectable waveguide beams have been released for movement, so the tests may be used to evaluate the deflection control provided to the deflectable waveguide beams by the deflection electrodes. In selected embodiments, the horizontal waveguide structures in the scribe area mirror structures are stabilized against movement during testing. In any case, an optical test signal provided in a vertical plane to the wafer may be perpendicularly deflected by the scribe area mirror structure and into the lateral plane of the wafer for reception at a corresponding deflectable waveguide beams at the die where it is processed by an optical element in the die. Conversely, test response signals generated by the optical element in the die may be transmitted by the deflectable waveguide beam, across the recess opening, and to the scribe area mirror structure where it is deflected perpendicularly out of the plane of the wafer.

Upon conclusion of the optical testing, a stabilization material or layer may be formed around the exposed horizontal waveguide structures in the deflectable waveguide beam at step 136. For example, any exposed deflectable MEMS optical beam waveguides in the die may be stabilized against move movement during subsequent singulation processing by injecting or depositing a sacrificial layer of stabilization material in the recess opening to surround the deflectable MEMS optical beam waveguides, followed by an optional planarization or CMP step. In other embodiments, the stabilization material may be reformed by at least partially filling the recess openings.

At step 137, the wafer may be singulated into individual integrated circuit die, such as by using a full saw cut process along specified die edge singulation lines to separate the wafer into individual die. At step 138, the stabilization material is removed from around any exposed deflectable MEMS optical beam waveguides at the die edge to permit the waveguides to move under control of deflection voltages applied to the surrounding deflection electrodes. At step 139, the individual die may be packaged and sent for further inspection and testing. For example, each of singulated die 163, 166, 168 may be attached to one or more conductor and system board or substrate structures in a protective packaging or housing which completely surrounds and encases each die to seal and protect the die from moisture, contamination, corrosion, and mechanical shock, such as by applying, transfer molding, injection molding, or otherwise forming a protective layer to seal the die stack. At step 140, the process ends.

While wafer singulation processing may be used to separate each wafer into separate dice by cutting through the scribe street or grid areas, at least one of the die on a wafer may be processed as a production test die which is connected or mounted to a production package for use in testing wafer die. To this end, the singulation process may be controlled to separate a selected die along with the adjacent scribe street or grid areas (including embedded scribe area mirror structures) surrounding the selected die, thereby forming a single production test die. By connecting the production test die and production package to a test head, optical probe testing of wafer die may be performed by using the scribe area mirrors on the production test die to match optical test outputs from the production test die to the optical inputs on the wafer die under test. In particular, the test head may provide power and control signals to the production test die which generates optical test signals as light beams that are directed through the embedded scribe area mirror structures of the production test die to the wafer and die under test. In this way, the light beams from the production test die and production package on the test head will match exactly the mirrors on the die under test.

Figure 13:
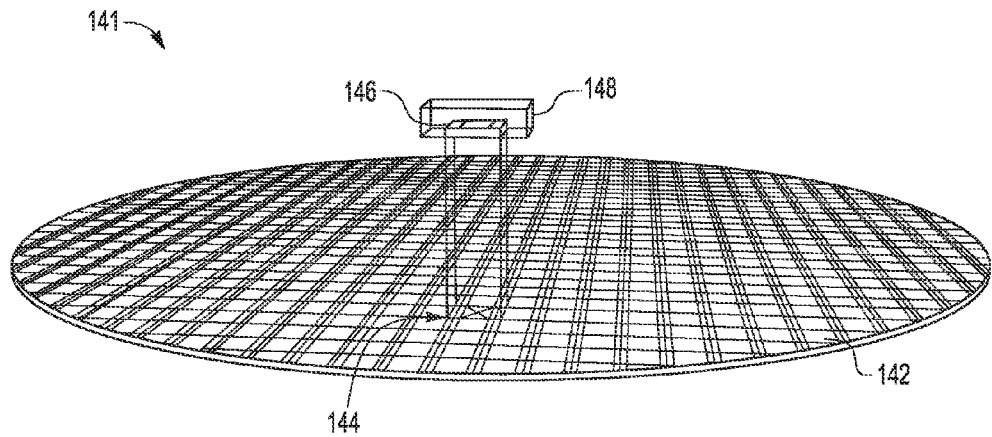
FIG. 13 illustrates a perspective view of a test die having embedded scribe street mirrors which is mounted on a test head for testing optical circuits on individual die on a wafer.

To illustrate selected optical wafer and die probe testing embodiments, reference is now made to FIG. 13 which illustrates a perspective view 141 of a production test die 146 mounted on a test head 148 and positioned over a wafer 142 to perform optical and electrical testing of circuits on individual wafer die (e.g., 144). As used herein, the positioning of the test head over the wafer may be done by moving the test head or moving the wafer, in either case changing the relative position of the test head and wafer. The alignment of the production test die 146 and test head 148 over a specific wafer die under test 144 is indicated with dashed lines.

As shown in FIG. 13, the wafer 142 has been fabricated to include a plurality of circuitized semiconductor die which may be singulated or diced to form individual integrated circuit (IC) chips. The outline of where the dicing will occur to form the various IC chips is shown with the cross-hatched pattern of lines defining scribe street or grid areas between individual die. In each scribe street or grid area around an individual die (e.g., 144), the wafer 142 includes a plurality of embedded scribe area mirror structures (not shown) which are positioned and arranged to receive optical test signals provided by the production test die 146 and to deflect the received optical test signals into the plane of the wafer die (e.g., 144) for use in optical testing of the die 144. In addition, each wafer die (e.g., 144) may include I/O pads (not shown) which are arranged in a predetermined pattern of conductors on an upper face or surface of the wafer 142 for use in performing electrical testing of the wafer die.

To support optical testing of the individual wafer die (e.g., 144), the production test die 146 includes embedded scribe street mirrors (not shown) which may be constructed as 45 degree mirrors located in the scribe street or grid area. As described herein, the embedded scribe area mirror structures in the production test die 146 are positioned and arranged to receive and deflect optical test signals from the production test die 146 down toward the wafer die under test (e.g., 144) for use in optical testing of the die 144. In addition, the production test die 146 may be mounted to a production package having a plurality of signal and I/O conductors arranged in a predetermined pattern. By providing the test head 148 with a plurality of contact pads also arranged in the same predetermined pattern, the test head 148 provides power and control signals to the production test die 146 for controlling the generation of optical test signals that are directed through the embedded scribe area mirror structures. To support electrical testing of the individual wafer die (e.g., 144), the production test die 146 may also include I/O pads (not shown) which are arranged in a predetermined pattern of conductors on a bottom face or surface of the production test die 146 for use in performing electrical testing of the wafer die (e.g., 144).

Figure 14:
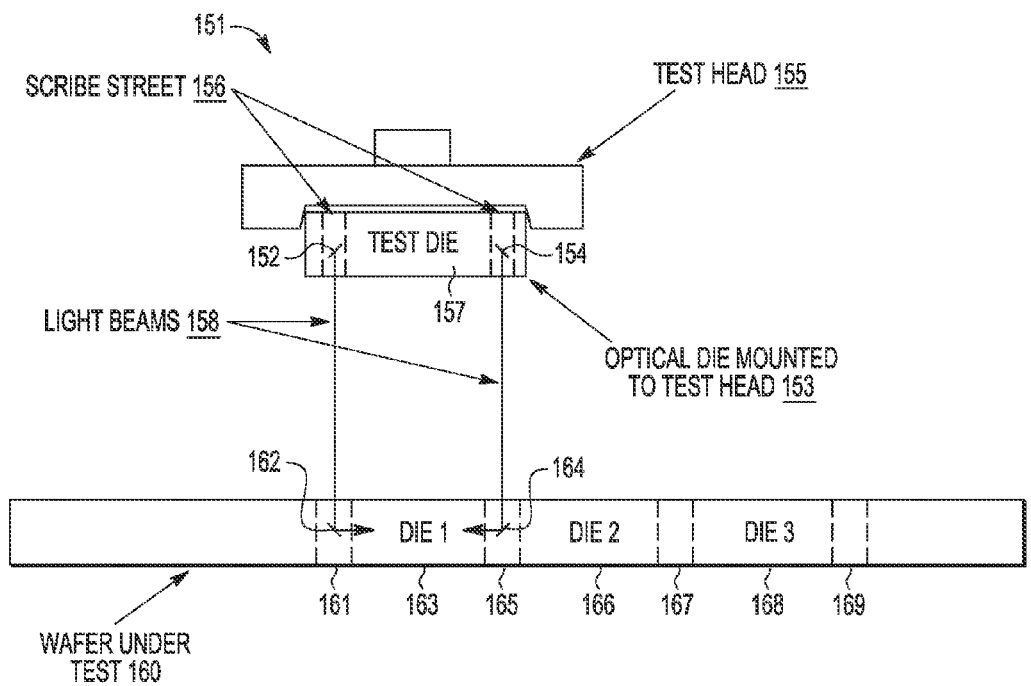
FIG. 14 illustrates a partial cutaway side view of a test die with embedded scribe street mirrors that is mounted on a test head for testing optical circuits on individual die on a wafer.

For additional details of selected optical wafer and die probe testing embodiments, reference is now made to FIG. 14 which illustrates a partial cross-sectional view of a test apparatus 151 for performing optical and electrical testing of circuits on the integrated circuits die 163, 166, 168 of a wafer under test 160. In the depicted wafer 160, each of the integrated circuit die 163, 166, 168 are separated from one another with scribe street or grid areas 161, 165, 167, 169 formed between individual die. For example, a first die (e.g., Die 1 163) is surrounded by scribe street or grid areas 161, 165 spacing the first die from the remainder of the wafer die. In the scribe street or grid areas (e.g., 161, 165) surrounding a die under test (e.g., 163), one or more embedded scribe area mirror structures (e.g., 162, 164) are formed in positions to receive optical test signals 158 provided by the production test die 157 and to deflect the received optical test signals into the plane of the wafer die under test (e.g., 163) for use in optical testing of optical circuit elements and/or waveguide beams therein. In addition, each wafer die under test (e.g., 163) may include I/O pads (not shown) which are arranged in a predetermined pattern of conductors on an upper face or surface of the die under test for use in performing electrical testing of the wafer die. Though not shown, it will be appreciated that embedded scribe area mirror structures are also formed in scribe areas (e.g., 167, 169) surrounding other integrated circuit die (e.g., 168) to receive and deflect optical test signals provided by the production test die 157 when positioned over the other integrated circuit die for optical testing.

In selected embodiments, the production test die 157 and wafer die (e.g., 163, 166, 168) may have identical features. In addition, the production test die 157 may include test circuits to facilitate testing of optical links using light beams 158, MEMS optical waveguide beams, mirrors (e.g., 152, 154, 162, 164), and optical elements (e.g., optical TX/RX circuits 113 shown in FIG. 9). As will be appreciated, the optical elements formed in the die (e.g., 157, 163) may not be bi-directional in cases where such elements only receive or transmit optical signals in normal operation. Even so, the production test die 157 and wafer die (e.g., 163, 166, 168) may include test circuitry for transmitting and receiving on all pins to test all of the MEMS optical waveguide beams formed in each wafer die. For a given optical link, the wafer die under test (e.g., 163) must be receiving when the production test die 157 is transmitting, and vice versa. To support testing of the MEMS optical waveguide beams formed in each wafer die, the production test die 157 and wafer die (e.g., 163, 166, 168) may include common test structure circuits, such as built-in self-test (BIST) circuits, built-in test (BIT) circuits, scan circuits, etc.

The depicted test apparatus 151 includes a test head 155 and attached test die 157 which may be positioned over each die (e.g., Die 1 163) in the wafer 160 being tested. As depicted, the integrated circuit test die 157 may be mounted on a production package (not shown) and/or removably plugged into a socket or mounting surface of a test head 155. Each test die 157 includes electrical and optical circuit elements formed therein which may be used to generate optical and/or electrical test signals. Each test die 157 also includes scribe street areas 156 in which embedded mirror structures 152, 154 are formed. Together, the test die 157 and scribe street areas 156 with embedded mirror structures 152, 154 form an optical die 153. To control the test die 157, the test head 155 may include circuitry and contact pads (not shown) that are arranged and positioned to provide power and control signals for controlling the generation of optical test signals 158 by the production test die 157. Using the embedded mirror structures 152, 154, these optical test signals 158 are deflected down toward the die under test (e.g., 163) where they are deflected by corresponding scribe area mirror structures 164, 162 in the scribe street areas 165, 161.

By fabricating the test die 157 and embedded scribe area mirrors 152, 154 with the same wafer fabrication processing steps used to form the die under test 163 and embedded scribe area mirrors 162, 164 in the wafer 160, the test die 157 is produced as a production die that can perform optical probe testing of wafer die using aligned scribe area mirrors 152/154, 162/164 to match optical test outputs from the test die 157 to the optical inputs on the device under test 163. Thus, rather than designing a special test head for optical wafer tests, the test head 155 can be configured to hold an a production optical die 157 with the mirrors 152, 154 in the scribe grid to direct the light beam signals 158 to the matching scribe grid mirror inputs 162, 164 for the wafer or die under test 163.

By now it should be appreciated that there is provided herein method and apparatus for fabricating a die by performing optical die probe wafer testing on the die. In the disclosed methodology and apparatus, a wafer is provided that includes a first die of a predetermined size surrounded by a first scribe grid which includes a first optical deflection mirror positioned to receive an optical test signal in a first plane that is perpendicular to the lateral plane of the wafer and to perpendicularly deflect the received optical test signal to an optical waveguide beam located in the first die. In selected embodiments, the wafer is fabricated with a plurality of integrated circuit die formed in regular pattern on the wafer and a corresponding scribe grid surrounding each die, where each die has a predetermined size and includes a copy of an electro-optical circuit with a first optical waveguide beam located in a lateral plane of the wafer at a peripheral die edge of said die, and where each scribe grid surrounding a die includes a scribe grid optical deflection mirror which is positioned for receiving an optical test signal in a plane that is perpendicular to the lateral plane of the wafer and for perpendicularly deflecting the received optical test signal for optical communication with the first optical waveguide beam. In such embodiments, the production test die may be fabricated to include a copy of the electro-optical circuit in each die and a second optical waveguide beam located in a lateral plane of the production test die at a peripheral die edge of the production test die, where the second scribe grid includes a second scribe grid optical deflection mirror which is positioned to perpendicularly deflect an optical signal received from the second optical waveguide beam to a plane that is perpendicular to the lateral plane of the production test die. In selected embodiments, the optical waveguide beam is formed as a cantilevered silicon beam surrounded by one or more deflection electrodes, where the cantilevered silicon beam extends into a first deflection cavity which extends to the peripheral die edge of the first die and which is at least partially filled with the first stabilization structure. The first optical deflection mirror may be formed with an angled interface deflection surface that is offset by 45 degrees from the lateral plane of the wafer. In the optical die probe wafer testing methodology, a test head is provided that includes a production test die of the predetermined size surrounded by a second scribe grid. In selected embodiments, the test head is provided by packaging the production test die and surrounding second scribe grid in a packaged test die, and then attaching the packaged test die to a contact pad face on the test head having contact pads arranged to match a plurality of I/O pads located on the production test die. In other embodiments, the test head is provided by attaching the production test die and surrounding second scribe grid to a contact pad face on the test head having contact pads arranged to match a plurality of I/O pads located on the production test die. As formed, the second scribe grid includes a second optical deflection mirror positioned in the second scribe grid to receive an optical test signal in a lateral plane of the production test die and to perpendicularly deflect the received optical test signal to a second plane that is perpendicular to the lateral plane of the production test die. The second optical deflection may be formed with an angled interface deflection surface that is offset by 45 degrees from the lateral plane of the production test die. By positioning the test head over the wafer to align the first optical deflection mirror and the second optical deflection mirror, optical die probe testing may be performed on the first die by directing a first optical test signal from the production test die, through the second and first optical deflection mirrors, and to the first die. In addition, optical die probe testing may include directing a first optical test response signal from the first die to deflect off the first optical deflection mirror and second optical deflection mirror for reception at an optical waveguide beam formed in the production test die in the lateral plane of the production test die. In selected embodiments, the optical die probe testing is performed by forming a recess opening in the first scribe grid of the wafer to substantially reveal at least a distal end of the first cantilevered silicon beam, and then performing optical die probe testing on the first die using at least a first optical signal that is received at the first optical deflection mirror in the first plane that is perpendicular to a lateral plane of the wafer and perpendicularly deflected at the first optical deflection mirror into the lateral plane of the wafer for transmission across the recess opening for reception at the cantilevered silicon beam. After performing optical die probe testing, the first die may be singulated from the wafer and then packaged in a packaging structure.

In another form, there is disclosed an integrated circuit device and method for making same. As disclosed, a first die is provided that is singulated from a wafer and that is subjected to one or more optical wafer die probe tests while in wafer form. The wafer includes a first die, a first optical waveguide beam located at a peripheral die edge of the first die, and a first scribe grid which includes a first optical deflection mirror located proximate to the peripheral die edge of the first die for perpendicularly deflecting optical signals to and/or from the first optical waveguide beam. The first optical deflection mirror may be formed with angled interface deflection surface that is offset by 15 degrees from the lateral plane of the wafer. With this arrangement, a second die that is a copy of the first die is used to perform one or more optical wafer die probe tests on the first die by generating an optical test signal with the second die. As formed, the second die may include a second optical waveguide beam located at a peripheral die edge of the second die, and a second scribe grid having a second optical deflection mirror located proximate to the peripheral die edge of the second die for perpendicularly deflecting optical signals to and/or from the second optical waveguide beam. The optical wafer die probe tests are performed by attaching the second die and surrounding second scribe grid to a test head device, such as by attaching the second die and surrounding second scribe grid to a contact pad face on the test head device having contact pads formed on a contact pad face and arranged to match a plurality of I/O pads formed on the second die. Thus attached, the test head device may be positioned over the wafer to align the second optical deflection mirror over the first optical deflection mirror, and the optical die probe testing may be performed on the first die by directing a first optical test signal from the second die for perpendicular deflection off the second optical deflection mirror and first optical deflection mirror for reception at the first optical waveguide beam in the lateral plane of the first die. In response, a first optical test response signal is directed from the first die for perpendicular deflection off the first optical deflection mirror and second optical deflection mirror for reception at the second optical waveguide beam in the lateral plane of the second die.

In yet another form, there is disclosed an optical wafer test system which includes a wafer chuck and test head device disposed over the wafer chuck for relative movement in relation to individual semiconductor die in the semiconductor wafer. The wafer chuck is provided to support, hold, or mount a semiconductor wafer having a plurality of semiconductor die formed thereon. As formed, each semiconductor die includes a copy of an electro-optical circuit having an optical beam waveguide and is surrounded by a scribe grid in which is formed one or more first optical deflection mirrors having an angled deflection surface that is offset by 45 degrees from a lateral plane of the wafer and positioned for optical communication with a corresponding optical beam waveguide ire the surrounded semiconductor die. The optical waveguide beam formed in each semiconductor die may be formed as a cantilevered silicon beam surrounded by one or more deflection electrodes, where the cantilevered silicon beam extends into a deflection cavity which extends to the peripheral die edge of the semiconductor die and which is at least partially filled with the first stabilization structure. Attached to the test head device is a packaged production test die and surrounding second scribe grid. As formed, the production test die includes a copy of the electro-optical circuit in each of the semiconductor die. In addition, the surrounding second scribe grid includes one or more second optical deflection mirrors having an angled deflection surface that is offset by 45 degrees from a lateral plane of the production test die and positioned for optical communication with a corresponding optical beam waveguide in the surrounded production test die. In this way, the one or more second optical deflection mirrors are positioned for alignment with the one or more first optical deflection mirrors when the production test die is disposed over a semiconductor die under test when performing optical die probe testing on semiconductor die under test. The test head device may include a contact pad face comprising contact pads arranged to match a plurality of I/O pads formed on the production test die. In operation, the test head device provides power and control signals to the production test die for generating optical test signals that are directed through the one or more second optical deflection mirrors in the second scribe grid for perpendicular deflection to the semiconductor die under test.

Although the described exemplary embodiments disclosed herein are directed to various optical die test interface devices and methods for making and using same to use scribe area optical mirror structures for testing MEMS optical beam waveguide and optical circuit elements, the present invention is not necessarily limited to the example embodiments which illustrate inventive aspects of the present invention that are applicable to a wide variety of fabrication processes and/or structures. Thus, the particular embodiments disclosed above are illustrative only and should not be taken as limitations upon the present invention, as the invention may be modified and practiced in different but equivalent manners apparent to those skilled in the art having the benefit of the teachings herein. For example, while the scribe area mirror structures are described with example fabrication sequence details, this is merely for convenience of explanation and not intended to be limiting and persons of skill in the art will understand that the principles taught herein apply to other fabrication processes and materials. Moreover, the thicknesses, materials, and processing of the described layers may deviate from the disclosed examples. In addition, the terms of relative position used in the description and the claims, if any, are interchangeable under appropriate circumstances such that embodiments of the invention described herein are, for example, capable of operation in other orientations than those illustrated or otherwise described herein. The term "coupled," as used herein, is defined as directly or indirectly connected in an electrical or non-electrical manner. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method comprising:
providing a wafer comprising a first die of a predetermined size surrounded by a first scribe grid comprising a first optical deflection mirror positioned in the first scribe grid for receiving an optical test signal in a first plane that is perpendicular to the lateral plane of the wafer and for perpendicularly deflecting the received optical test signal to an optical waveguide beam located in the first die;

providing a test head comprising a production test die surrounded by a second scribe grid comprising a second optical deflection mirror positioned in the second scribe grid for receiving an optical test signal in a lateral plane of the production test die and for perpendicularly deflecting the received optical test signal to a second plane that is perpendicular to the lateral plane of the production test die;

positioning the test head over the wafer to perform optical die probe testing on the first die by aligning the first optical deflection mirror and the second optical deflection mirror; and performing optical die probe testing on the first die by directing a first optical test signal from the production test die, through the second and first optical deflection mirrors, and to the first die.

2. The method of claim 1, where providing the wafer comprises fabricating a plurality of die formed in regular pattern on the wafer and a corresponding scribe grid surrounding each die,
where each die has a predetermined size and comprises a copy of an electro-optical circuit with a first optical waveguide beam located in a lateral plane of the wafer at a peripheral die edge of said die, and where each scribe grid surrounding a die comprises a scribe grid optical deflection mirror which is positioned for receiving an optical test signal in a plane that is perpendicular to the lateral plane of the wafer and for perpendicularly deflecting the received optical test signal for optical communication with the first optical waveguide beam.

3. The method of claim 2, where the production test die comprises a copy of the electro-optical circuit in each die and a second optical waveguide beam located in a lateral plane of the production test die at a peripheral die edge of the production test die, and where the second scribe grid comprises a second scribe grid optical deflection mirror which is positioned to perpendicularly deflect an optical signal received from the second optical waveguide beam to a plane that is perpendicular to the lateral plane of the production test die.

4. The method of claim 1, where providing the test head comprises:

packaging the production test die and surrounding second scribe grid in a packaged test die; and attaching the packaged test die to a contact pad face on the test head comprising contact pads arranged to match a plurality of I/O pads located on the production test die.

5. The method of claim 1, where providing the test head comprises:

attaching the production test die and surrounding second scribe grid to a contact pad face on the test head comprising contact pads arranged to match a plurality of I/O pads located on the production test die.

6. The method of claim 1, where performing optical die probe testing on the first die comprises directing a first optical test response signal from the first die to deflect off the first optical deflection mirror and second optical deflection mirror for reception at an optical waveguide beam located in the production test die in the lateral plane of the production test die.

7. The method of claim 1, where the first optical deflection mirror positioned in the first scribe grid comprises an angled interface deflection surface that is offset by 45 degrees from the lateral plane of the wafer.

8. The method of claim 1, where the second optical deflection mirror positioned in the second scribe grid comprises an angled interface deflection surface that is offset by 45 degrees from the lateral plane of the production test die.

9. The method of claim 1, where the optical waveguide beam located in the first die comprises a cantilevered silicon beam surrounded by one or more deflection electrodes, where the cantilevered silicon beam extends into a first deflection cavity which extends to the peripheral die edge of the first die and which is at least partially filled with a stabilization structure.

10. The method of claim 1, where performing optical die probe testing on the first die comprises:

forming a recess opening in the first scribe grid of the wafer to substantially reveal at least a distal end of the first cantilevered silicon beam; and performing optical die probe testing on the first die using at least a first optical signal that is received at the first optical deflection mirror in the first plane that is perpendicular to a lateral plane of the wafer and perpendicularly deflected at the first optical deflection mirror into the lateral plane of the wafer for transmission across the recess opening for reception at the cantilevered silicon beam.

11. The method of claim 1, further comprising:

singulating the first die from the wafer after performing optical die probe testing; and packaging the first die in a packaging structure.

12. A method for making an integrated circuit device comprising:

providing a wafer with a first die that is subjected to one or more optical wafer die probe tests while in wafer form; and singulating the first die from the wafer;

where the wafer comprises a first optical waveguide beam located at a peripheral die edge of the first die, and a first scribe grid comprising a first optical deflection mirror located proximate to the peripheral die edge of the first die for perpendicularly deflecting optical signals to and/or from the first optical waveguide beam, and where the one or more optical wafer die probe tests are performed by generating an optical test signal with a second die comprising a second optical waveguide beam located at a peripheral die edge of the second die, and a second scribe grid comprising a second optical deflection mirror located proximate to the peripheral die edge of the second die for perpendicularly deflecting optical signals to and/or from the second optical waveguide beam.

13. The method of claim 12, where the one or more optical wafer die probe tests are performed with the second die and second scribe grid attached to a test head device.

14. The method of claim 12, where the one or more optical wafer die probe tests are performed by:

positioning the test head device over the wafer to align the second optical deflection mirror over the first optical deflection mirror; and performing optical die probe testing on the first die by directing a first optical test signal from the second die for perpendicular deflection off the second optical deflection mirror and first optical deflection mirror for reception at the first optical waveguide beam in the lateral plane of the first die.

15. The method of claim 14, further comprising directing a first optical test response signal from the first die for perpendicular deflection off the first optical deflection mirror and second optical deflection mirror for reception at the second optical waveguide beam in the lateral plane of the second die.

16. The method of claim 13, where, during testing, the second die and second scribe grid are attached to a contact pad face on the test head device comprising contact pads located on a contact pad face and arranged to match a plurality of I/O pads located on the second die.

17. The method of claim 12, where the first optical deflection mirror comprises an angled interface deflection surface that is offset by 45 degrees from the lateral plane of the wafer.

18. An optical wafer test system comprising:

a wafer chuck for supporting a semiconductor wafer having a plurality of semiconductor die formed thereon, wherein each semiconductor die comprises a copy of an electro-optical circuit having an optical beam waveguide and is surrounded by a scribe grid comprising one or more first optical deflection mirrors having an angled deflection surface that is offset by 45 degrees from a lateral plane of the wafer and positioned for optical communication with a corresponding optical beam waveguide in the surrounded semiconductor die;

a test head device disposed over the wafer chuck for relative movement in relation to individual semiconductor die in the semiconductor wafer, the test head for holding a packaged production test die and surrounding second scribe grid attached to the test head device, where the production test die comprises an electro-optical circuit, where the surrounding second scribe grid comprises one or more second optical deflection mirrors having an angled deflection surface that is offset by 45 degrees from a lateral plane of the production test die and positioned for optical communication with a corresponding optical beam waveguide in the surrounded production test die, and where the one or more second optical deflection mirrors are positioned for alignment with the one or more first optical deflection mirrors when the production test die is disposed over a semiconductor die under test when performing optical die probe testing on semiconductor die under test.

19. The optical wafer test system of claim 18, where the test head device provides power and control signals to the production test die for generating optical test signals that are directed through the one or more second optical deflection mirrors in the second scribe grid for perpendicular deflection to the semiconductor die under test.

* * * * *